United States Patent
Fang et al.

(10) Patent No.: US 9,412,598 B2
(45) Date of Patent: Aug. 9, 2016

(54) EDGE ROUNDED FIELD EFFECT TRANSISTORS AND METHODS OF MANUFACTURING

(75) Inventors: Shenqing Fang, Fremont, CA (US); Tung-Sheng Chen, Cupertino, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 682 days.

(21) Appl. No.: 12/973,756

(22) Filed: Dec. 20, 2010

(65) Prior Publication Data

US 2012/0153377 A1 Jun. 21, 2012

(51) Int. Cl.
| | |
|---|---|
| *H01L 21/336* | (2006.01) |
| *H01L 21/3105* | (2006.01) |
| *H01L 21/321* | (2006.01) |
| *H01L 29/792* | (2006.01) |
| *H01L 21/28* | (2006.01) |
| *H01L 27/115* | (2006.01) |
| *H01L 29/51* | (2006.01) |

(52) U.S. Cl.
CPC .... *H01L 21/28282* (2013.01); *H01L 21/28202* (2013.01); *H01L 27/11568* (2013.01); *H01L 29/518* (2013.01)

(58) Field of Classification Search
USPC .......... 438/216, 287, 591, 595; 257/E21.423, 257/E21.294, E29.309
IPC ..................... H01L 21/28282, 29/66833, 29/792
See application file for complete search history.

(56) References Cited

U.S. PATENT DOCUMENTS

| | | | |
|---|---|---|---|
| 5,847,427 A * | 12/1998 | Hagiwara | ....................... 257/324 |
| 6,187,633 B1 * | 2/2001 | Dong et al. | .................... 438/261 |
| 6,808,992 B1 | 10/2004 | Ko et al. | |
| 6,927,129 B1 | 8/2005 | Sun et al. | |
| 6,943,401 B1 | 9/2005 | Fang | |
| 6,974,995 B1 | 12/2005 | Hui et al. | |
| 6,987,696 B1 | 1/2006 | Wang et al. | |
| 7,029,975 B1 | 4/2006 | Fang et al. | |
| 7,151,028 B1 | 12/2006 | Fang et al. | |
| 7,170,130 B2 | 1/2007 | Fang et al. | |
| 7,301,193 B2 | 11/2007 | Fang et al. | |
| 7,317,222 B2 | 1/2008 | Swift et al. | |
| 7,488,657 B2 | 2/2009 | Fang et al. | |
| 7,675,104 B2 | 3/2010 | Joshi et al. | |
| 7,732,276 B2 | 6/2010 | Fang et al. | |
| 7,829,936 B2 | 11/2010 | Shen et al. | |
| 7,851,306 B2 | 12/2010 | Fang et al. | |
| 2005/0199944 A1 | 9/2005 | Chen et al. | |
| 2006/0007752 A1 | 1/2006 | Wang et al. | |
| 2007/0037371 A1 | 2/2007 | Wang et al. | |
| 2008/0023750 A1 | 1/2008 | Xue et al. | |
| 2008/0083946 A1 | 4/2008 | Fang et al. | |

(Continued)

OTHER PUBLICATIONS

International Search Report for International Application No. PCT/US2011/065930 dated Jul. 30, 2012; 3 pages.

(Continued)

*Primary Examiner* — Marcos D Pizarro

(57) ABSTRACT

Embodiments of the present technology are directed toward gate sidewall engineering of field effect transistors. The techniques include formation of a blocking dielectric region and nitridation of a surface thereof. After nitridation of the blocking dielectric region, a gate region is formed thereon and the sidewalls of the gate region are oxidized to round off gate sharp corners and reduce the electrical field at the gate corners.

3 Claims, 10 Drawing Sheets

(56) References Cited

U.S. PATENT DOCUMENTS

| | | |
|---|---|---|
| 2008/0142874 A1* | 6/2008 | Fang et al. .................... 257/324 |
| 2008/0149990 A1 | 6/2008 | Wang et al. |
| 2008/0150000 A1 | 6/2008 | Suh et al. |
| 2008/0150011 A1 | 6/2008 | Chan et al. |
| 2008/0153224 A1 | 6/2008 | Wang et al. |
| 2008/0171416 A1 | 7/2008 | Fang et al. |
| 2008/0277712 A1 | 11/2008 | Ding et al. |
| 2009/0253244 A1* | 10/2009 | Lee et al. ..................... 438/437 |
| 2009/0261406 A1 | 10/2009 | Suh et al. |
| 2009/0268500 A1 | 10/2009 | Fang et al. |
| 2009/0269916 A1 | 10/2009 | Kang et al. |
| 2009/0278173 A1 | 11/2009 | Fang et al. |
| 2009/0289369 A1 | 11/2009 | Fang et al. |
| 2010/0065940 A1 | 3/2010 | Kim et al. |
| 2010/0078814 A1 | 4/2010 | Roy et al. |
| 2010/0085811 A1 | 4/2010 | Suh et al. |
| 2010/0133646 A1 | 6/2010 | Fang et al. |
| 2010/0207191 A1 | 8/2010 | Fang et al. |
| 2010/0230743 A1 | 9/2010 | Fang et al. |
| 2010/0276746 A1 | 11/2010 | Fang et al. |

OTHER PUBLICATIONS

SIPO Office Action for Application No. 201180067895.5 dated Jul. 22, 2015; 6 pages.

Written Opinion of the International Searching Authority for International Application No. PCT/US2011/065930 mailed 07/30/201202/09/2009; 5 pages.

SIPO Office Action for Application No. 201180067895.5 dated Mar. 29, 2016; 2 pages.

\* cited by examiner

US 9,412,598 B2

EDGE ROUNDED FIELD EFFECT TRANSISTORS AND METHODS OF MANUFACTURING

BACKGROUND OF THE INVENTION

Data storage devices are an important part of numerous electronic devices such as computers, smart phones, digital content players (e.g., MP3 players), game consoles, control systems, and the like. Many electronic devices include non-volatile solid state memory devices, such as flash memory. One common type of flash memory device is the charge trapping (CT) NAND integrated circuit (IC). FIG. 1 shows an exemplary CT-NAND based flash memory IC. The flash memory IC 100 includes a CT-NAND memory cell array 110, control circuits 120, column decoders 130, row decoders 140, input/output (I/O) buffers 150, and the like fabricated on a monolithic semiconductor substrate. The control circuits 120, column decoders 130, row decoders 140, I/O buffers 150, and the like operate to read and write data 160 at an address 170, 175 in the memory cell array 110 in accordance with various control signals 180 received by, internal to, and/or output from the flash memory IC 100. The circuits of the flash memory IC 100 are well known in the art and therefore those aspects of the flash memory IC 100 not particular to embodiments of the present technology will not be discussed further.

Referring now to FIG. 2, an exemplary memory cell array is shown. The CT-NAND memory cell array 110 includes a plurality of CT field effect transistors (FET) 210, a plurality of drain select gates 220, a plurality of source select gates 230, a plurality of bit lines 240, a plurality of word lines 250, a plurality of drain select signal lines 260, and a plurality of source select signal lines 270. Each column of the array 110 includes a drain select gate 220, a plurality of CT-FETs 210, and a source select gate 230 serially connected source to drain between a corresponding bit line 240 and a ground potential 280. The gates of each of a plurality of CT-FETs 210 in each row of the array 110 are coupled to a corresponding word line 250. The gate of each drain select gate 220 is connected to a corresponding drain select signal line 260. The gate of each source select gate 230 is connected to a corresponding drain select signal line 270. In one implementation, the CT-FETs may be silicon-oxide-nitride-oxide-silicon (SONOS) FETs or the like. The CT-NAND memory cell array 110 is well known in the art and therefore those aspects of the CT-NAND memory cell array 110 not particular to embodiments of the present technology will not be discussed further.

In a CT-NAND memory cell array 110 a given memory cell is programmed by injecting charge into a charge trapping layer across a tunneling dielectric layer of the CT-FET 210. The given memory cell is erased by removing the charge from the charge trapping layer across the tunneling dielectric layer. In one implementation, the CT-FET 210 is programmed and erased using Fowler-Nordheim (F-N) tunneling. The process of programming and erasing the CT-FET memory cell 210 damages the tunneling dielectric layer resulting in a finite number of program-erase cycles that can be performed on the flash memory IC 100. Accordingly, there is a continued need for improved CT-FET memory cells 210 and the like.

SUMMARY OF THE INVENTION

The present technology may best be understood by referring to the following description and accompanying drawings that are used to illustrate embodiments of the present technology directed toward field effect transistor gate engineering.

In one embodiment, a fabrication method includes forming a tunneling dielectric region on a substrate. A charge trapping region is formed on the tunneling dielectric region. A blocking dielectric region is formed on the charge trapping region. The surface of the blocking dielectric region is nitridated and then a gate region is formed on the nitridated surface of the blocking dielectric region. The gate region is then oxidized, wherein edges of the gate region are rounded and encroachment of the block dielectric region into the gate region is suppressed by the nitridated blocking dielectric region.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

In this application, the use of the disjunctive is intended to include the conjunctive. The use of definite or indefinite articles is not intended to indicate cardinality. In particular, a reference to "the" object or "a" object is intended to denote also one of a possible plurality of such objects.

Figure 1:
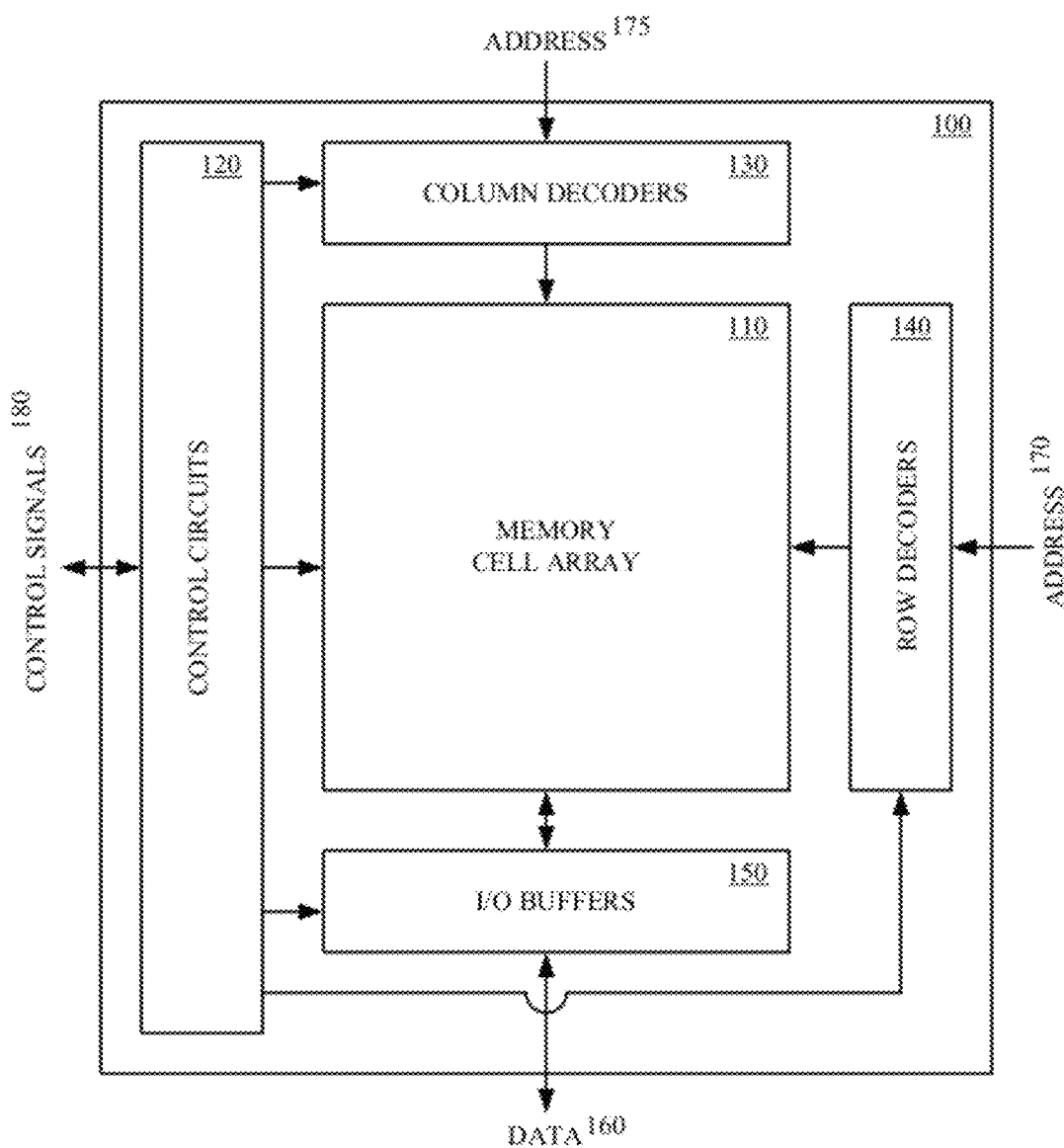
FIG. 1 shows a block diagram of an exemplary CT-NAND based flash memory IC according to the conventional art.
Figure 2:
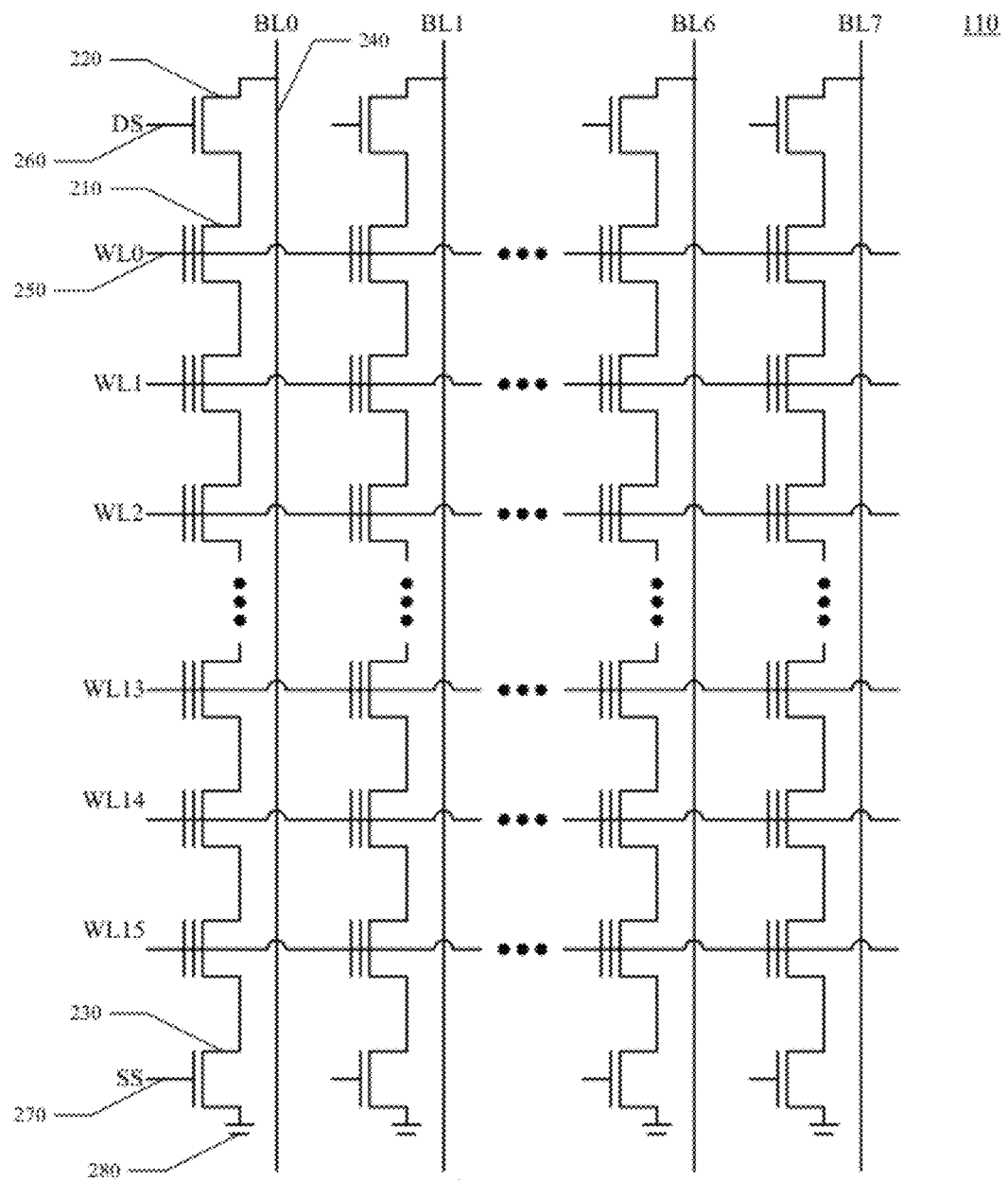
FIG. 2 shows a block diagram of an exemplary memory cell array according to the conventional art.
Figure 3:
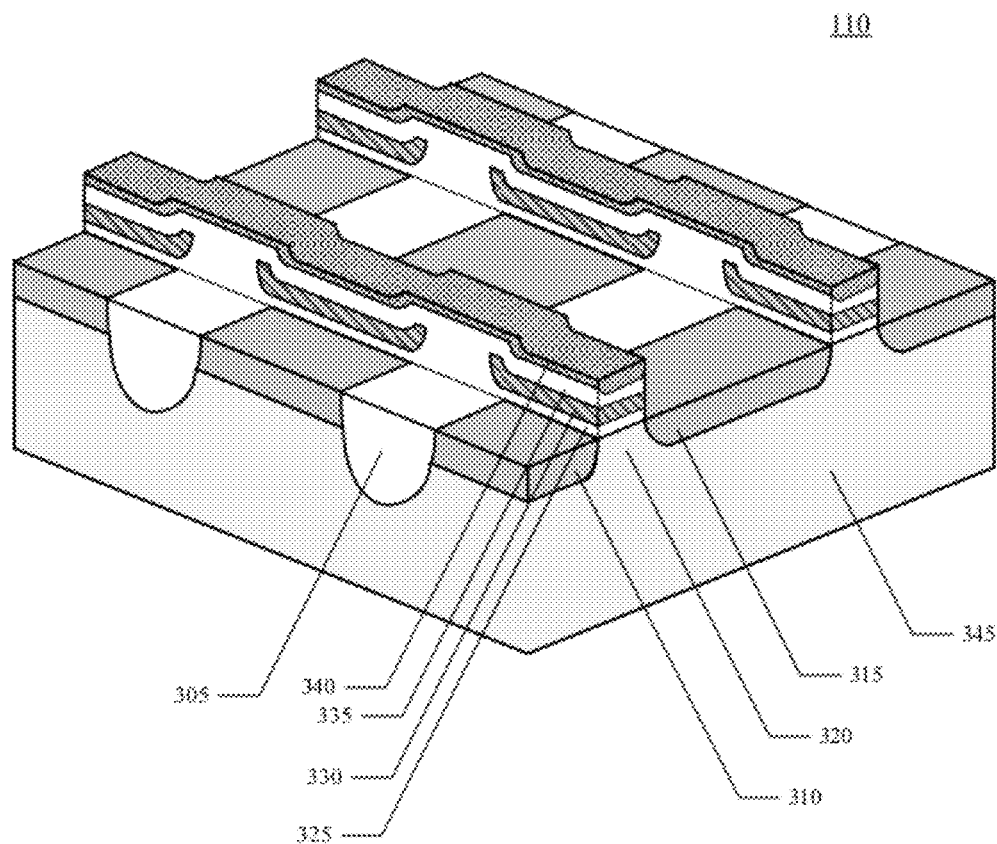
FIG. 3 shows a block diagram of a memory cell array structure, in accordance with one embodiment of the present technology.

Referring to FIG. 3, a memory cell array structure, in accordance with one embodiment of the present technology, is shown. In one implementation, the memory cell array may be a CT-NAND memory cell array 110. However, it is appreciated that embodiments of the present technology may be applied to any field effect transistor device. In one implementation, each column of CT-FETs may be separated by a shallow trench isolation (STI) region 305. Each CT-FET may include a drain region 310, a source region 315, a channel region 320, a tunneling dielectric region 325 (also commonly referred to as a bottom dielectric region), a charge trapping region 330, a blocking dielectric region 335 (also commonly referred to as a top dielectric region), and a gate region 340. The source and drain regions 310, 315 may be semiconductor regions of the substrate 345 having a heavy doping concentration of a first type of impurity. In one implementation, the source and drain regions 310, 315 may be silicon heavily doped with phosphorous or arsenic. The channel region 320 may be a semiconductor region of the substrate 345 having moderate doping concentration of a second type of impurity, disposed laterally between the source and drain regions 310, 315. In one implementation, the channel region 320 may be silicon moderately doped with boron. The tunneling dielectric region 325 may be a dielectric layer disposed over the channel region 320 and adjacent portions of the source and drain regions 310, 315. In one implementation, the tunneling dielectric region 325 may be silicon oxide, oxynitride, silicon oxynitride, or the like layer. The charge trapping region 330 may be a dielectric, semiconductor or the like layer disposed between the tunneling dielectric region 325 and the blocking dielectric region 335. In one implementation, the charge trapping region 330 may be a nitride, silicon-rich-nitride, or the like layer. The blocking dielectric region 335 may be a dielectric layer disposed between the charge trapping region 330 and the gate region 340. In one implementation, the blocking dielectric region 335 may be a silicon oxide, oxynitride, silicon oxynitride, or the like layer. The gate region 340 may be a semiconductor or a conductor layer disposed on the blocking dielectric region 335 opposite the charge trapping region 330. In one implementation, the gate region 340 may be a polysilicon layer having a heavy doping concentration of the first type of impurity.

The surface of the blocking dielectric region 335 is nitrided before the gate region 340 is formed. The nitridation of the surface of the blocking dielectric region 335 suppresses oxidation encroachment into the gate region 340 at the interface with the blocking dielectric region 335. Therefore, the thickness of blocking dielectric 335 is substantially the same at the center and edges of the gate region 340 as the gate edge is rounded in the following oxidation step.

Figure 4:
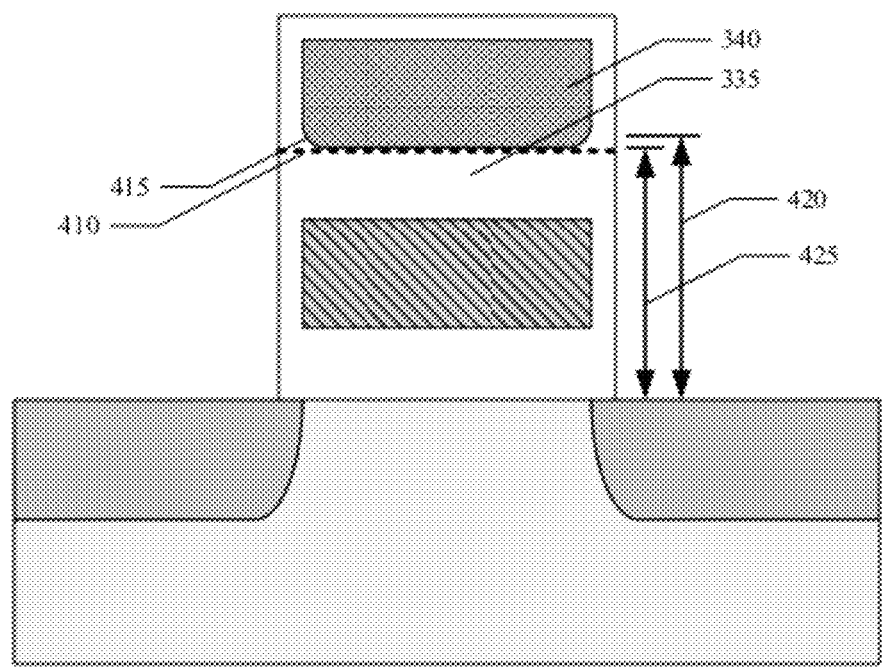
FIG. 4 shows a block diagram of an enlarged cross-sectional view of a CT-FET, in accordance with embodiments of the present technology.
Figure 5A:
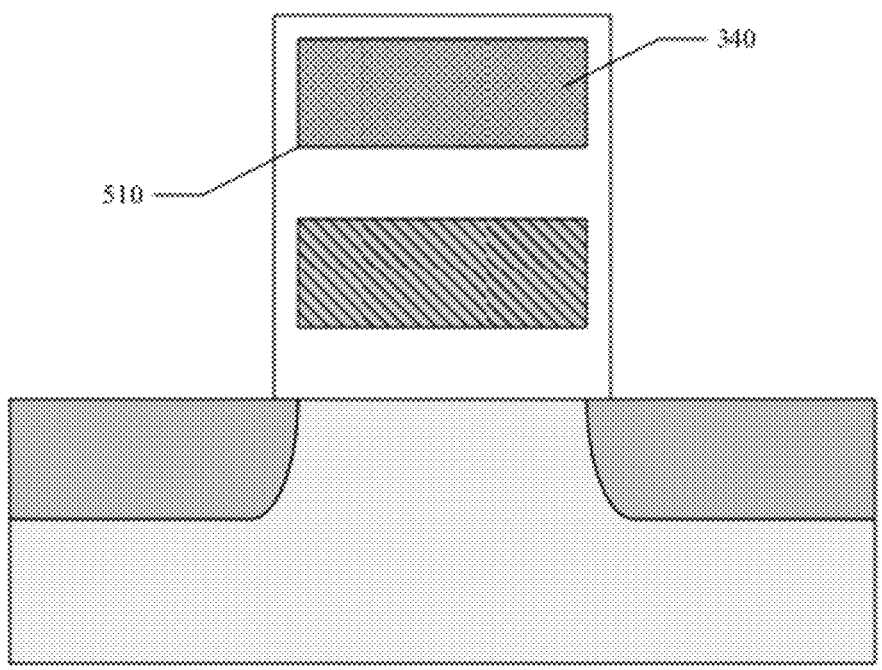
FIGS. 5A and 5B show block diagrams of CT-FETs according to the conventional art.
Figure 5B:
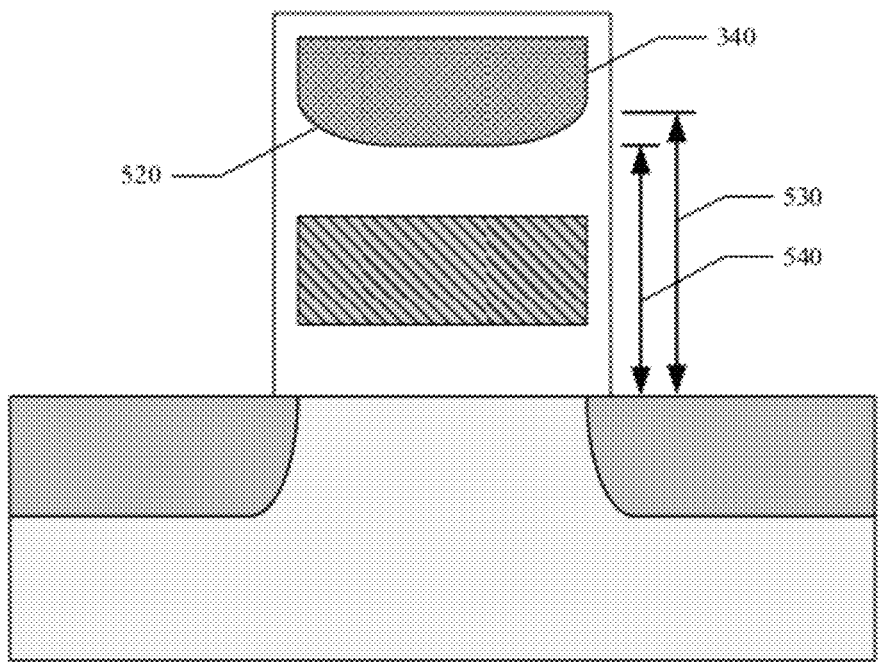

Referring now to FIG. 4, an enlarged cross-sectional view of a CT-FET, in accordance with embodiments of the present technology, is shown. The nitridation 410 of the blocking dielectric region 335 reduces oxidation encroachment into the gate region 340. The reduced encroachment results in a blocking dielectric thickness at the edges 420 that is substantially the same as the effective dielectric thickness at the center 425 of the gate region 340, which increases program-erase endurance. In comparison, a CT-FET having no appreciable gate region 340 edge rounding 510 according to the conventional art is illustrated in FIG. 5A. If the gate region 340 of a CT-FET does not have any appreciable edge rounding 510, the electric field during erasing is substantially higher at the edges of the gate region 340. The substantially higher electric field at the edges decreases the program-erase endurance of the CT-FET due to electron injection from the gate edge. In FIG. 5B, a CT-FET having gate region edge rounding 520 produced by oxidation according to the conventional art is illustrated. The gate sidewall oxidation to round gate corners 520 produces encroachment which makes the block dielectric at the gate edges thicker 530 than at the gate center 540. The encroachment of the blocking dielectric region 335 into the gate region 340, resulting from oxidation, reduces the effective electric field across the blocking dielectric region 335. The increase in the effective thickness of blocking dielectric 335 due to encroachment of the block dielectric region 335 into the gate region 340 decreases the program-erase speed of the flash memory IC. Accordingly, the gate side-wall engineering utilizing blocking dielectric nitridation to suppress oxidation encroachment at the edges of the gate region improves the performance of the CT-FETs in flash memory ICs over the conventional art. It is also appreciated that gate side-wall engineering utilizing blocking dielectric nitridation to suppress oxidation encroachment at the edges of gate regions may be applied to improve the performance of other integrated circuits including FETs.

Figure 6A:
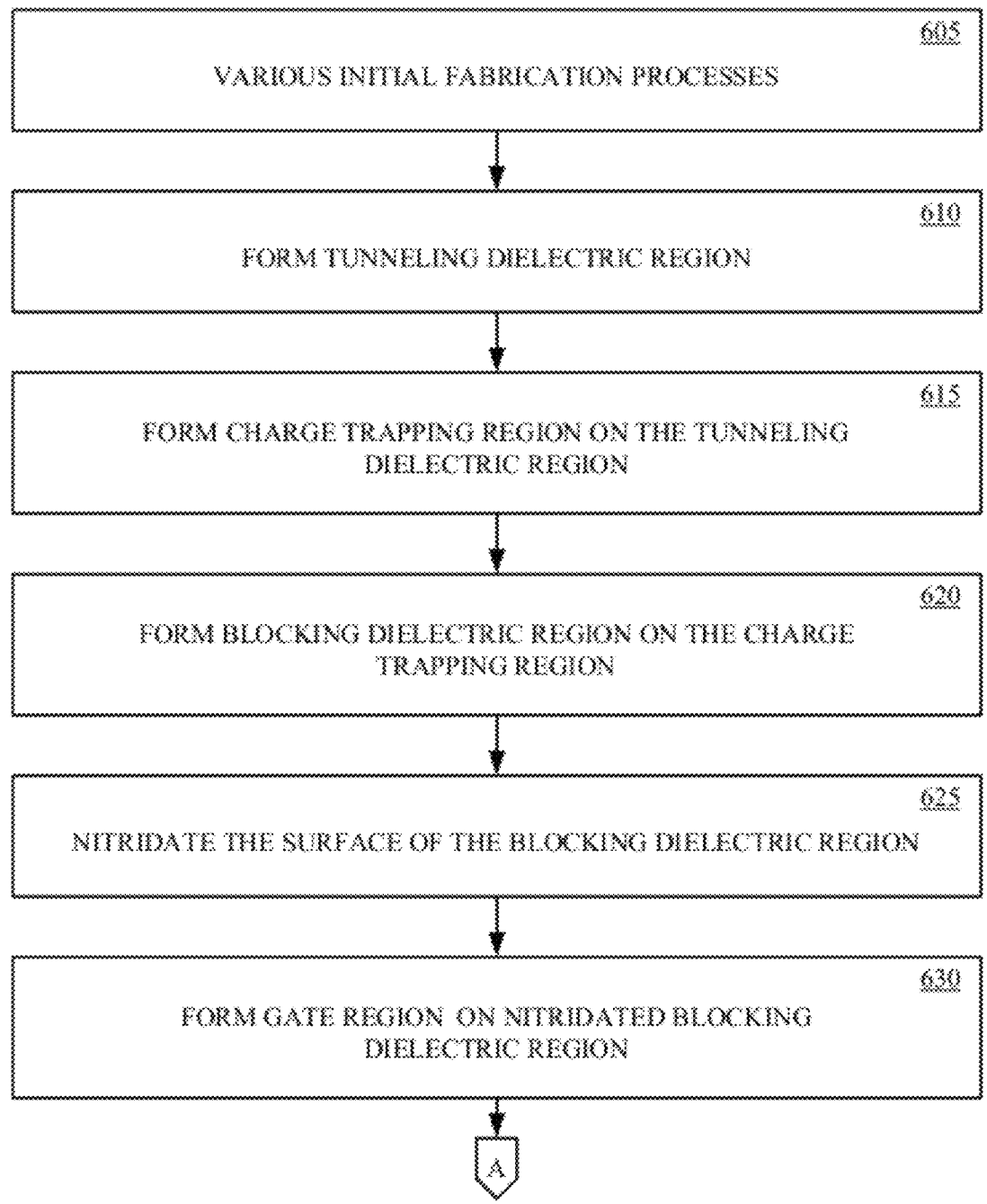
FIGS. 6A and 6B show a flow diagram of a method of fabricating a memory cell array, in accordance with one embodiment of the present technology.
Figure 6B:
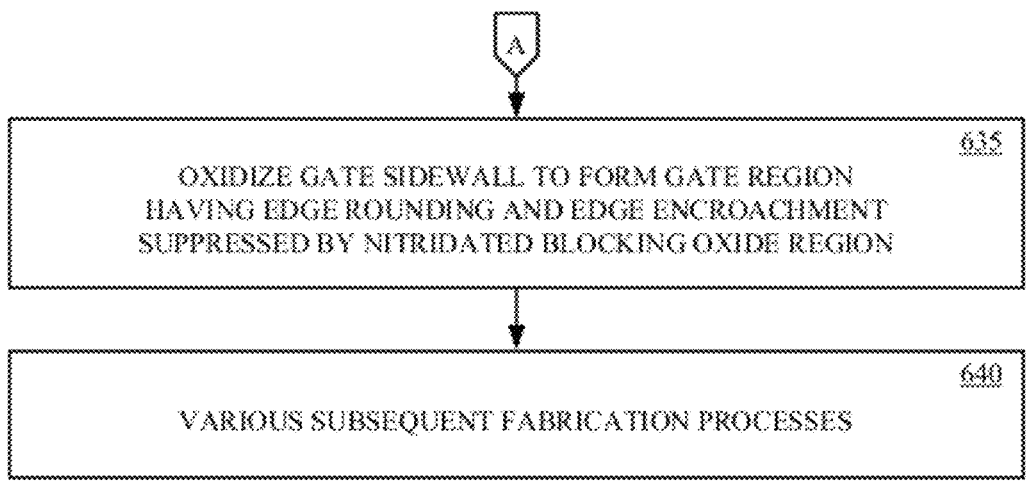
Figure 7A:
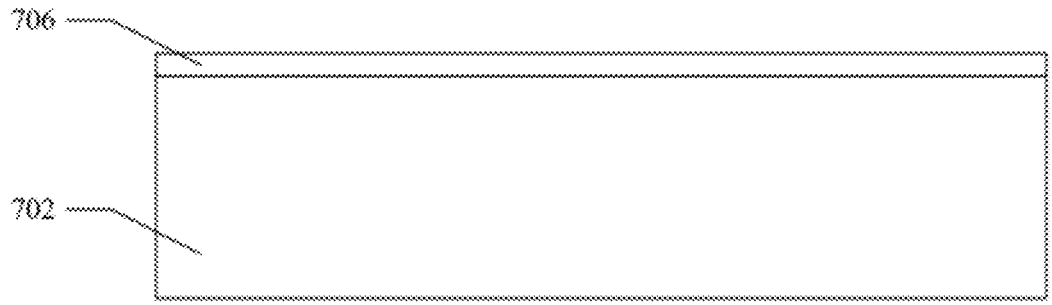
FIGS. 7A-7E show block diagrams illustrating fabrication of a memory cell array, in accordance with one embodiment of the present technology.

Referring now to FIGS. 6A-6B, a method of fabricating a memory cell array, in accordance with one embodiment of the present technology, is shown. The method of fabricating the memory cell array will be further explained with reference to FIGS. 7A-7E, which illustrates fabrication of the memory cell array, in accordance with one embodiment of the present technology. As depicted in FIGS. 6A and 7A, the process begins, at 605, with various initial processes upon a semiconductor wafer substrate 702, such as cleaning, depositing, doping, etching and/or the like. The substrate 702 may be a semiconductor doped at a first concentration with a first dopant type. In one implementation, the substrate 702 may be silicon moderately doped with boron (P).

At 610, a tunneling dielectric region 706 is formed on the substrate 702. In one implementation, the tunneling dielectric region 706 may be formed by oxidizing the exposed surface of the substrate 702 in the memory cell array region by any well known thermal dry oxidation process. In another implementation, the tunneling dielectric region 706 may be formed by depositing a silicon oxynitride film by any well known chemical vapor deposition process. In one implementation, the tunneling dielectric region 706 may be formed to a thickness of about 3 to 8 nanometers.

Figure 7B:
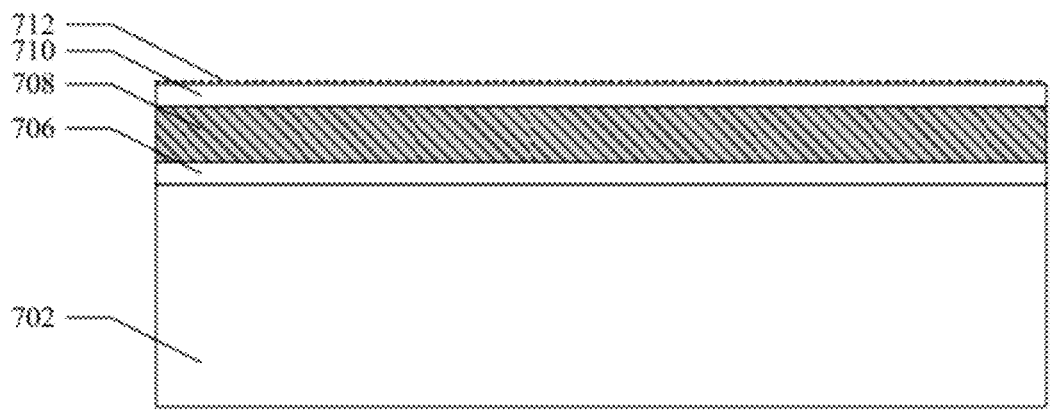

Referring now to FIG. 7B, charge trapping region 708 is formed on the tunneling dielectric region 706, at 615. At 620, a blocking dielectric region 710 is formed on the charge trapping region 708. In one implementation, the charge trapping region and blocking dielectric region may be formed by first depositing a nitride layer 708, by any well know process such a chemical vapor deposition (CVD) or atomic layer deposition (ALD), on the tunneling dielectric region 706. The nitride layer may include silicon rich nitride having an atomic ratio of silicon to nitrogen that is about 3:4 or greater. The charge trapping region may be formed by depositing multiple layers, such as a nitride layer on a silicon rich nitride layer. In addition, one or more of the layers may have substantially constant and/or graded concentration profiles. A sacrificial oxide may then be formed on the silicon nitride layer by any well known process. The sacrificial oxide and a portion of the nitride layer may then be etched back, before a portion of the remaining nitride layer is oxidized to form an oxynitride or silicon oxynitride layer 710. In one implementation, the resulting charge trapping region 708 may be formed to a thickness of about 4 to 15 nanometers and the resulting blocking dielectric region 710 may be formed to a thickness of about 3 to 8 nanometers.

At 625, the exposed surface of the blocking dielectric region 710 is nitridated 712. In one implementation, the exposed surface of the oxynitride or silicon oxynitride layer 710 is exposed to nitrogen in a furnace anneal or the like process.

Figure 7C:
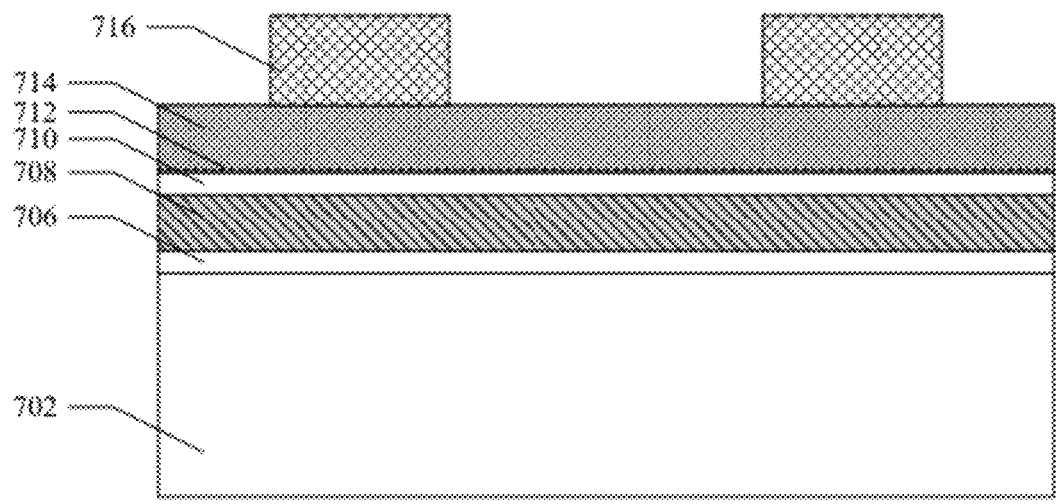
Figure 7D:
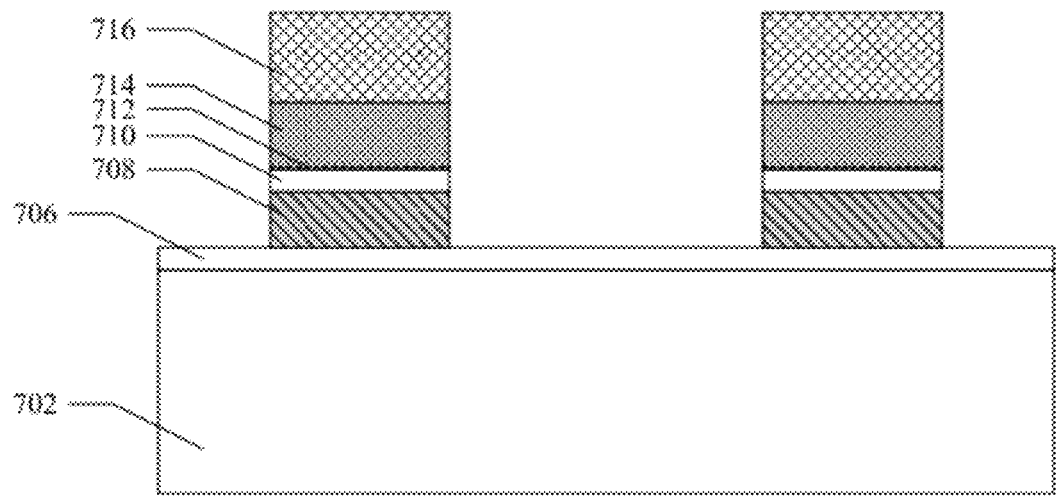

Referring now to FIG. 7C, a gate region 714 is formed on the blocking dielectric region 710, at 630. In one implementation, a polysilicon layer 714 is deposited, by any well known process such as chemical vapor deposition, on the nitridated oxynitride layer 712, 710. A photo resist is deposited on the polysilicon layer 714 and patterned by any well know photolithography process to form a gate/charge trapping mask 716. Referring now to FIG. 7D, the polysilicon layer 714, nitridated oxynitride layer 712, 710, and nitride layer 708 exposed by the gate/charge trapping mask 716 are then selectively etched by any well known anisotropic etching process. The gate/charge trapping mask 716 may then be removed by any well known process such as resist striping or resist ashing.

Figure 7E:
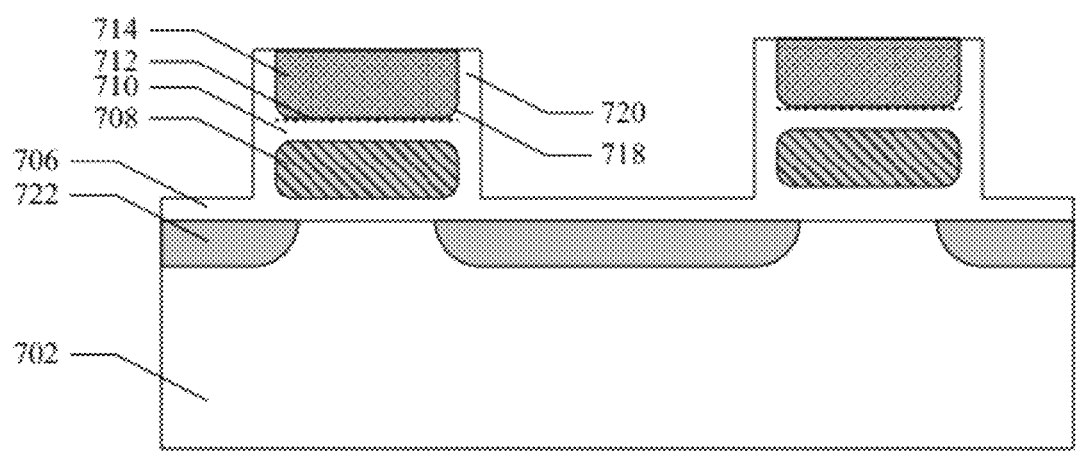

Referring now to FIGS. 6B and 7E, the gate region 714, and optionally the charge trapping region 708, is oxidized, wherein gate corner edge rounding 718 of the gate region 714 is done while encroachment is suppressed by the nitridated blocking dielectric region 712, 710, at 635. In one implementation, the sidewalls of the gate region 714, and optionally the charge trapping region 708, are oxidized to form gate region 712, and optionally charge trapping region 708, having suppressed edge rounding 718 with suppressed encroachment, and a sidewall dielectric layer 720.

At 640, the process continues with various subsequent processes, such as implanting, doping, etching, cleaning and/or the like, to form one or more additional regions, such as source, drain and channel regions, gate, source and drain contacts, peripheral circuits, interconnects, vias, passivation layer and/or the like. The source/drain region 704 may be portions of the substrate 702 doped at a second concentration with a second dopant type. In one implementation, the source/drain regions 704 may be silicon heavily doped with phosphorous or arsenic (N+). It is appreciated that the above described method of fabricating a memory cell array may also include other additional processes and that the order of the processes may vary from the order described above.

Embodiments of the present technology advantageously suppress encroachment by the block dielectric region into the gate region while rounding off the sharp edges and corners of the gate region. The encroachment is advantageously suppressed by nitridation of the blocking dielectric region. The electrical oxide thickness (EOT) between the gate region and the channel region is substantially the same at the center and the edge of the gate region as a result of the suppressed edge encroachment during oxidation rounding of gate edges and corners. Furthermore, program-erase speed and endurance is advantageously increased by the suppressed edge encroachment of the gate region and/or substantially the same EOT between the gate region and the channel region at the center and the edge of the gate region.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method comprising:
    forming a tunneling dielectric region on a substrate;
    forming a charge trapping region on the tunneling dielectric region and a blocking dielectric region on the charge trapping region by depositing a nitride or silicon rich nitride layer, forming an oxide layer on the nitride or silicon rich nitride layer, etching back the oxide layer and a portion of the nitride or silicon rich nitride layer, and then oxidizing a portion of the remaining nitride or silicon rich nitride layer to form an oxynitride or silicon oxynitride layer on a final nitride or silicon rich nitride layer;
    nitridating a surface of the blocking dielectric region;
    forming a gate region on the nitridated blocking dielectric region; and
    oxidizing the gate region to form a sidewall dielectric layer, wherein edge encroachment of the gate region during oxidizing the gate region to form the sidewall dielectric layer is suppressed by the nitridated blocking dielectric region.

2. The method according to claim 1, further comprising oxidizing the charge trapping region along with the gate region.

3. The method according to claim 1, wherein nitridating the surface of the blocking dielectric region comprises exposing the surface of the blocking dielectric region to nitrogen in a furnace anneal.

* * * * *